(12) United States Patent
Zou

(10) Patent No.: US 10,297,780 B2
(45) Date of Patent: May 21, 2019

(54) ORGANIC LIGHT-EMITTING DISPLAY PANEL, METHOD FOR FABRICATING THE SAME, AND ORGANIC LIGHT-EMITTING DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xin Zou, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/739,863

(22) PCT Filed: Nov. 23, 2017

(86) PCT No.: PCT/CN2017/112630
§ 371 (c)(1),
(2) Date: Dec. 26, 2017

(65) Prior Publication Data
US 2019/0115401 A1 Apr. 18, 2019

(30) Foreign Application Priority Data
Oct. 18, 2017 (CN) .......................... 2017 1 0990913

(51) Int. Cl.
*H01L 27/32* (2006.01)
*H01L 51/50* (2006.01)
(Continued)

(52) U.S. Cl.
CPC ...... *H01L 51/5209* (2013.01); *H01L 27/3209* (2013.01); *H01L 27/3246* (2013.01);
(Continued)

(58) Field of Classification Search
None
See application file for complete search history.

(56) References Cited

U.S. PATENT DOCUMENTS

| | | | |
|---|---|---|---|
| 6,433,487 B1 * | 8/2002 | Yamazaki | ........... H01L 27/3281 315/169.3 |
| 7,091,666 B2 | 8/2006 | Kim et al. | |

(Continued)

FOREIGN PATENT DOCUMENTS

| | | |
|---|---|---|
| CN | 105720085 A | 6/2016 |
| CN | 107403811 A | 11/2017 |

*Primary Examiner* — J. E. Schoenholtz
(74) *Attorney, Agent, or Firm* — Hauptman Ham, LLP

(57) ABSTRACT

An organic light-emitting display and a method for fabricating the same, and an organic lighting display are provided. The organic light-emitting display includes a substrate and at least one lighting unit formed on the substrate, and the at least one lighting includes: an anode layer; an organic layer formed on the anode layer; and a pixel define layer formed at two sides of the anode layer and the organic layer and touching the two sides of the anode layer and the organic layer, and inner sides of the pixel define layer touching the anode layer and the organic layer have hydrophilic material; wherein at least one part of the anode layer is downward recessed to form a first arcuate recess, and the organic layer is downward recessed and formed in the first arcuate recess.

13 Claims, 2 Drawing Sheets

(51) Int. Cl.
  *H01L 51/52* (2006.01)
  *H01L 51/56* (2006.01)
(52) U.S. Cl.
  CPC ...... *H01L 51/5072* (2013.01); *H01L 51/5092* (2013.01); *H01L 51/5206* (2013.01); *H01L 51/5221* (2013.01); *H01L 51/56* (2013.01)

(56) References Cited

U.S. PATENT DOCUMENTS

| | | | |
|---|---|---|---|
| 7,903,055 B2 * | 3/2011 | Nishikawa | H01L 51/5209 257/40 |
| 9,466,650 B2 | 10/2016 | Wang et al. | |
| 9,583,739 B2 * | 2/2017 | Hirakata | H01L 51/5281 |
| 9,711,577 B2 * | 7/2017 | Zhang | H01L 51/56 |
| 9,735,214 B2 | 8/2017 | Park et al. | |
| 9,935,287 B2 * | 4/2018 | Hu | H01L 27/3246 |
| 2004/0017153 A1 * | 1/2004 | Nishikawa | H01L 27/3258 313/506 |
| 2008/0024402 A1 * | 1/2008 | Nishikawa | H01L 51/5209 345/82 |
| 2014/0203303 A1 * | 7/2014 | Jiang | H01L 51/56 257/88 |
| 2014/0291648 A1 * | 10/2014 | Yamazaki | H01L 51/525 257/40 |
| 2015/0333110 A1 * | 11/2015 | Park | H01L 21/308 257/40 |
| 2016/0049617 A1 * | 2/2016 | Ma | H01L 51/5275 257/40 |
| 2017/0005286 A1 * | 1/2017 | Yun | H01L 51/5209 |
| 2017/0194395 A1 * | 7/2017 | Hu | H01L 27/3246 |
| 2018/0033964 A1 * | 2/2018 | Liu | H01L 51/52 |
| 2018/0166648 A1 * | 6/2018 | Dai | H01L 51/56 |

* cited by examiner

ORGANIC LIGHT-EMITTING DISPLAY PANEL, METHOD FOR FABRICATING THE SAME, AND ORGANIC LIGHT-EMITTING DISPLAY DEVICE

RELATED APPLICATIONS

The present application is a National Phase of International Application Number PCT/CN2017/112630, filed Nov. 23, 2017, and claims the priority of China Application No. 201710990913.6, filed Oct. 18, 2017.

FIELD OF THE DISCLOSURE

The disclosure relates to an organic lighting display technical field, and more particularly to an organic light-emitting display, a method for fabricating the same, and an organic light-emitting display.

BACKGROUND

Since the organic lighting technology was invented, the organic lighting technology has rapidly developed due to its wide visual angle, high contrast, wide color gamut, and fast response speed. Each pixel of an organic lighting display is composed of a cathode, an anode, and an organic layer therebetween. When a voltage is applied to the cathode and the anode, holes transmits from the anode to a lighting layer between a hole injection layer and a hole transporting layer and electrons transmits from the cathode to the lighting layer through an electron injection layer and an electron transporting layer. The holes and the electrons are recombined in the lighting layer to emit light.

The organic lighting display includes a low temperature poly-silicon (LTPS) circuit backplane controlling a path to the anode, a pixel define layer on the anode, and an organic layer. The organic layer is formed on the anode under the opening of the pixel define layer using an evaporation method or an ink jetting and printing method. In an ink jetting and printing process, a printer jets a solution into the opening of the pixel define layer. The pixel define layer and the solution have hydrophilic and hydrophobic properties. In a size as small as a pixel, the surface of the jetted solution is non-uniform such that the thickness of a single pixel has larger difference. The color and brightness of light emitted by the edge of the pixel is different from that of light emitted by the middle of the pixel, so that the display effect of the organic light-emitting display is bad.

SUMMARY

A technical problem to be solved by the disclosure is to provide an organic light-emitting display and a method for fabricating the same, and an organic lighting display to overcome the problem with the bad display effect of the organic light-emitting display.

An objective of the disclosure is achieved by following embodiments. In particular, the organic light-emitting display includes a substrate and at least one lighting unit formed on the substrate, and the at least one lighting includes: an anode layer; an organic layer formed on the anode layer; and a pixel define layer formed at two sides of the anode layer and the organic layer and touching the two sides of the anode layer and the organic layer, and inner sides of the pixel define layer touching the anode layer and the organic layer have hydrophilic material; wherein at least one part of the anode layer is downward recessed to form a first arcuate recess, and the organic layer is downward recessed and formed in the first arcuate recess.

In an embodiment of the present invention, the organic light-emitting display comprises an organic light-emitting display. The organic light-emitting display includes a substrate and at least one lighting unit formed on the substrate, and the at least one lighting includes: an anode layer, an organic layer formed on the anode layer and a pixel define layer formed at two sides of the anode layer and the organic layer and touching the two sides of the anode layer and the organic layer, and inner sides of the pixel define layer touching the anode layer and the organic layer have hydrophilic material; wherein at least one part of the anode layer is downward recessed to form a first arcuate recess, and the organic layer is downward recessed and formed in the first arcuate recess.

In an embodiment of the present invention, the method for fabricating an organic light-emitting display light-emitting display comprising: providing a substrate; forming an anode layer on the substrate, and the anode layer is downward recessed to form a first arcuate recess; forming a pixel define layer at two sides of the first arcuate recess of the anode layer, and inner sides of the pixel define layer near the first arcuate recess have hydrophilic material; forming an organic layer in the first arcuate recess of the anode layer and at the inner sides of the pixel define layer, and the organic layer is downward recessed and formed in the first arcuate recess; forming a cathode layer on the organic layer, and the cathode layer is downward recessed and laminated to the organic layer; and forming a film package layer on top surfaces of the cathode layer and the pixel define layer, and the film package layer is downward recessed and laminated to the cathode layer.

Distinct from the conventional technology, a part of the anode layer of the organic light-emitting display of the present invention is downward recessed to form an arcuate recess, and the organic layer is downward recessed and laminated to the arcuate recess, and the inner sides of the pixel define layer have hydrophilic material. The organic light-emitting display of the present invention can overcome the problem with the non-uniform thickness of the organic layer in an ink-jetting process and improve the performance of the organic lighting display.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
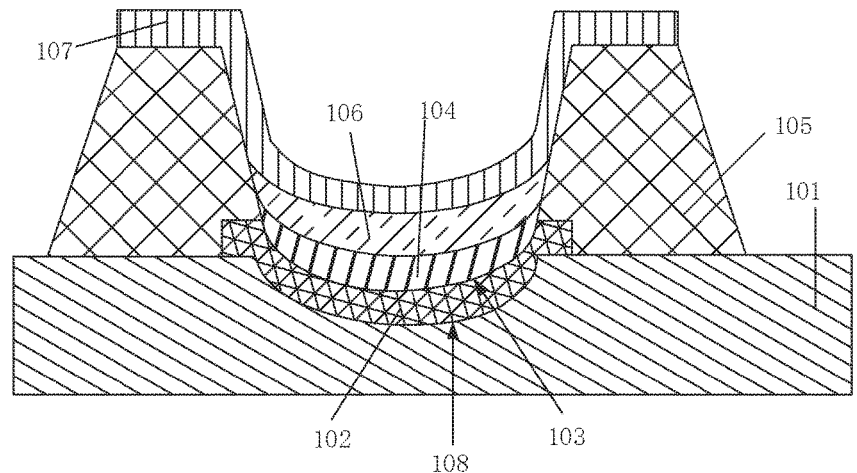
FIG. 1 is a structural schematic view of an organic light-emitting display according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

According to an embodiment of the present invention, the organic light-emitting display includes a substrate, an anode layer, a pixel define layer, an organic layer, a cathode layer, and a film package layer.

At least one lighting unit is formed on the substrate, and the at least one lighting includes the anode layer, the organic layer, the cathode layer, and the film package layer. A part of the anode layer is downward recessed to form a first arcuate recess. The organic layer is downward recessed and formed in the first arcuate recess of the anode layer. The pixel define layer is formed at two sides of the first arcuate recess to touch two ends of the organic layer. The inner sides of the pixel define layer touching the anode layer and the organic layer have hydrophilic material.

Wherever possible, the same reference numbers are used in the drawings and the description to refer to the same or like parts. In the drawings, the shape and thickness may be exaggerated for clarity and convenience.

Refer to FIG. 1. FIG. 1 is a structural schematic view of an organic light-emitting display according to an embodiment of the disclosure.

The organic light-emitting display of the present invention comprises a substrate 101, an anode layer 102, an organic layer 104, a pixel define layer 105, a cathode layer 106, and a film package layer 107.

The substrate 101 has an arcuate recess 108 thereon. The surface of the substrate 101 has a given position where the lighting unit is located, and the given position of the substrate 101 is bored by a laser. Afterwards, the substrate 101 is etched by an acid solution to form the concave of the arcuate recess that corresponds to the radian of the surface of the solution used in an ink jetting and printing process. The size and the radian of the arcuate recess 108 are adjusted according to the energy intensity of the laser and the concentration of the etching solution.

The anode layer 102 is formed in the arcuate recess 108, downward recessed and laminated to the arcuate recess 108 to form a first arcuate recess 103. In an embodiment, the anode layer 102 is formed using the low-temperature polysilicon technology. In order to improve the efficiency of injecting holes, the work function of the anode layer 102 is required to be high as much as possible. As a part of the display, the anode layer 102 should be transparent, whereby light penetrates through the anode layer 102. For example, the anode layer 102 comprises Au and transparent conductive polymers, such as polyaniline and ITO, but the present invention is not limited thereto.

The pixel define layer 105 is formed at two ends of the anode layer 102, the organic layer 104, and the cathode layer 106, and formed at two sides of the first arcuate recess 103 to form an opening. The pixel define layer 105 is formed during coating, exposing, developing, and etching processes. The inner sides of the pixel define layer 105 near the organic layer 104 have hydrophilic material. The top surface of the pixel define layer 105 has hydrophobic material. Since the inside material is hydrophilic, the surface of the solution used in the ink jetting process is concave. Since the top surface of the pixel define layer 105 has hydrophobic material, the solution used in the ink jetting process does not accumulate at the top surface of the pixel define layer 105.

The pixel define layer 105 has a given thickness, such as 1~20 um. Preferably, the pixel define layer 105 has a thickness of 1~10 um, but the present invention is not limited thereto. The organic layer 104 is accommodated in the opening of the pixel define layer 105 having a fixed thickness. Thus, the thickness of the pixel define layer 105 is adjusted according to the thickness of the organic layer 104 accommodated, but the present invention is not limited thereto.

The organic layer 104 is formed in the first arcuate recess 103, downward recessed and laminated to the first arcuate recess 103. Specifically, the organic layer 104 includes a hole injection layer, a hole transporting layer, a lighting layer, an electron transporting layer, and an electron injection layer. In an embodiment of the present invention, the organic layer 104 is formed by jetting ink into the opening of the pixel define layer 105 at two sides of the first arcuate recess 103. In this way, the surface of the solution forming the organic layer 104 corresponds to the concave of the first arcuate recess 103. As a result, the thickness of the organic layer 104 is uniform, and the lighting efficiency and utilization in material of the display are improved.

The cathode layer 106 is formed on the organic layer 104. The cathode layer 106 is downward recessed and laminated to the organic layer 104. In order to improve the efficiency of injecting electrons, the work function of the cathode is required to be low as much as possible, such that the lighting brightness and the life of the display increase. The cathode includes those of a single metal, an alloy or a layered electrode. The single metal may be Ag, Al, Li, Mg, Ca, or In. The alloy may be Mg:Ag (10:1) or Li:Al (0.6% Li). The layered electrode is composed of a thin insulation layer and a thick Al layer. The thin insulation layer may comprise LiF, $Li_2O$, MgO, or $Al_2O_3$.

The film package layer 107 covers the cathode layer 106 and the inner sides and the top surface of the pixel define layer 105. The film package layer 107 is formed during evaporation and package processes. The order and the times of the ink jetting process forming the organic layer 104 and the evaporation process forming the film package layer 107 can be changed according to the properties of the organic lighting display.

Distinct from the conventional technology, a part of the anode layer of the organic light-emitting display of the present invention is downward recessed to form an arcuate recess, and the organic layer is downward recessed and laminated to the arcuate recess, and the inner sides of the pixel define layer have hydrophilic material. The organic light-emitting display of the present invention can overcome the problem with the non-uniform thickness of the organic layer in an ink-jetting process and improve the display effect of the organic lighting display.

Figure 2:
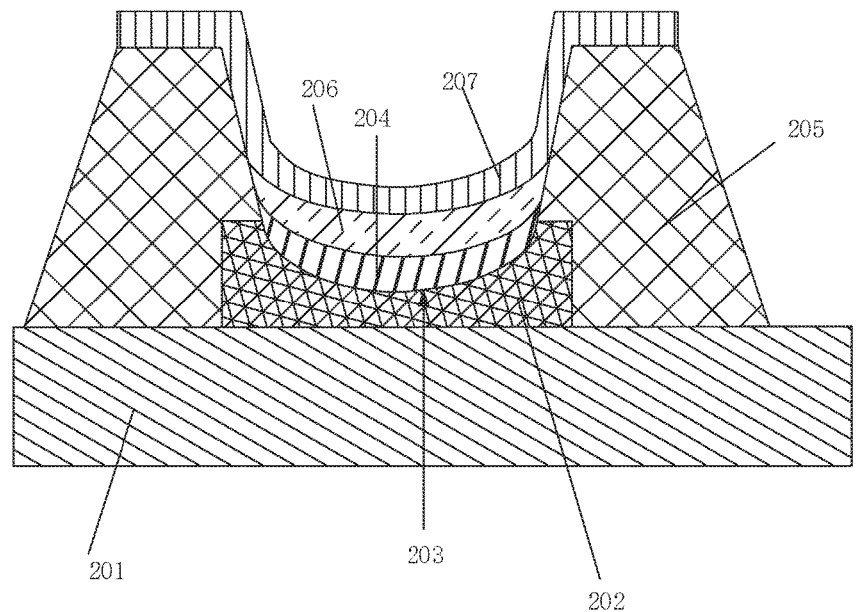
FIG. 2 is a structural schematic view of an organic light-emitting display according to another embodiment of the disclosure.

Refer to FIG. 2. FIG. 2 is a structural schematic view of an organic light-emitting display according to an embodiment of the disclosure.

The organic light-emitting display of the present invention comprises a substrate 201, an anode layer 202, an organic layer 204, a pixel define layer 205, a cathode layer 206, and a film package layer 207.

The substrate 202 has a uniform thickness. The anode layer 202 is formed on the substrate 201. The anode layer 202 is provided with a first arcuate recess 203 thereon. The number of the first arcuate recess 203 corresponds to the number of a lighting unit. The surface of the substrate 201 has a given position where the lighting unit is located, and the given position of the substrate 201 is bored by a laser. Afterwards, the substrate 201 is etched by an acid solution to form the concave of the first arcuate recess 203 that corresponds to the radian of the surface of the solution used in an ink jetting and printing process. The size and the radian of the first arcuate recess 203 are adjusted according to the energy intensity of the laser and the concentration of the etching solution. In an embodiment, the anode layer 202 is formed using the low-temperature polysilicon technology. In order to improve the efficiency of injecting holes, the work function of the anode layer 202 is required to be high as much as possible. As a part of the display, the anode layer 202 should be transparent, whereby light penetrates through the anode layer 202. For example, the anode layer 202 comprises Au and transparent conductive polymers, such as polyaniline and ITO, but the present invention is not limited thereto.

The pixel define layer 205 is formed at two sides of the first arcuate recess 203 to form an opening. The pixel define layer 205 is formed during coating, exposing, developing, and etching processes. The inner sides of the pixel define layer 205 near the organic layer 204 have hydrophilic material. The top surface of the pixel define layer 205 has hydrophobic material. The organic layer 204 is accommodated in the opening of the pixel define layer 205 having a fixed thickness. Thus, the thickness of the pixel define layer 205 is adjusted according to the thickness of the organic layer 204 accommodated, but the present invention is not limited thereto. Preferably, the pixel define layer 205 has a thickness of 1~10 um.

The organic layer 204 is formed in the first arcuate recess 203, downward recessed and laminated to the first arcuate recess 203. Specifically, the organic layer 204 includes a hole injection layer, a hole transporting layer, a lighting layer, an electron transporting layer, and an electron injection layer. In an embodiment of the present invention, the organic layer 204 is formed by jetting ink into the opening of the pixel define layer 205 at two sides of the first arcuate recess 203. In this way, the surface of the solution forming the organic layer 204 corresponds to the concave of the first arcuate recess 203. As a result, the thickness of the organic layer 204 is uniform, and the lighting efficiency and utilization in material of the display pane are improved.

The cathode layer 206 is formed on the organic layer 204. The cathode layer 206 is downward recessed and laminated to the organic layer 204. In order to improve the efficiency of injecting electrons, the work function of the cathode is required to be low as much as possible, such that the lighting brightness and the life of the display increase. The cathode includes those of a single metal, an alloy or a layered electrode. The single metal may be Ag, Al, Li, Mg, Ca, or In. The alloy may be Mg:Ag (10:1) or Li:Al (0.6% Li). The layered electrode is composed of a thin insulation layer and a thick Al layer. The thin insulation layer may comprise LiF, $Li_2O$, MgO, or $Al_2O_3$.

The film package layer 207 covers the cathode layer 206 and the inner sides and the top surface of the pixel define layer 205. The film package layer 207 is formed during evaporation and encapsulation processes.

In the abovementioned embodiment, the order and the times of the ink jetting process forming the organic layer 204 and the evaporation process forming the film package layer 207 can be changed according to the properties of the organic lighting display.

Distinct from the conventional technology, a part of the anode layer of the organic light-emitting display of the present invention is downward recessed to form an arcuate recess, and the organic layer is downward recessed and laminated to the arcuate recess, and the inner sides of the pixel define layer have hydrophilic material. The organic light-emitting display of the present invention can overcome the problem with the non-uniform thickness of the organic layer in an ink-jetting process and improve the performance of the organic lighting display.

Based on the identical invention concept, the present invention provides an organic lighting display, which comprises the abovementioned organic light-emitting display. The overcome technical problem and the principle of the organic lighting display are similar to those of the organic light-emitting display so will not be reiterated.

Distinct from the conventional technology, a part of the anode layer of the organic light-emitting display of the present invention is downward recessed to form an arcuate recess, and the organic layer is downward recessed and laminated to the arcuate recess, and the inner sides of the pixel define layer have hydrophilic material. The organic light-emitting display of the present invention can overcome the problem with the non-uniform thickness of the organic layer in an ink-jetting process and improve the performance of the organic lighting display.

Figure 3:
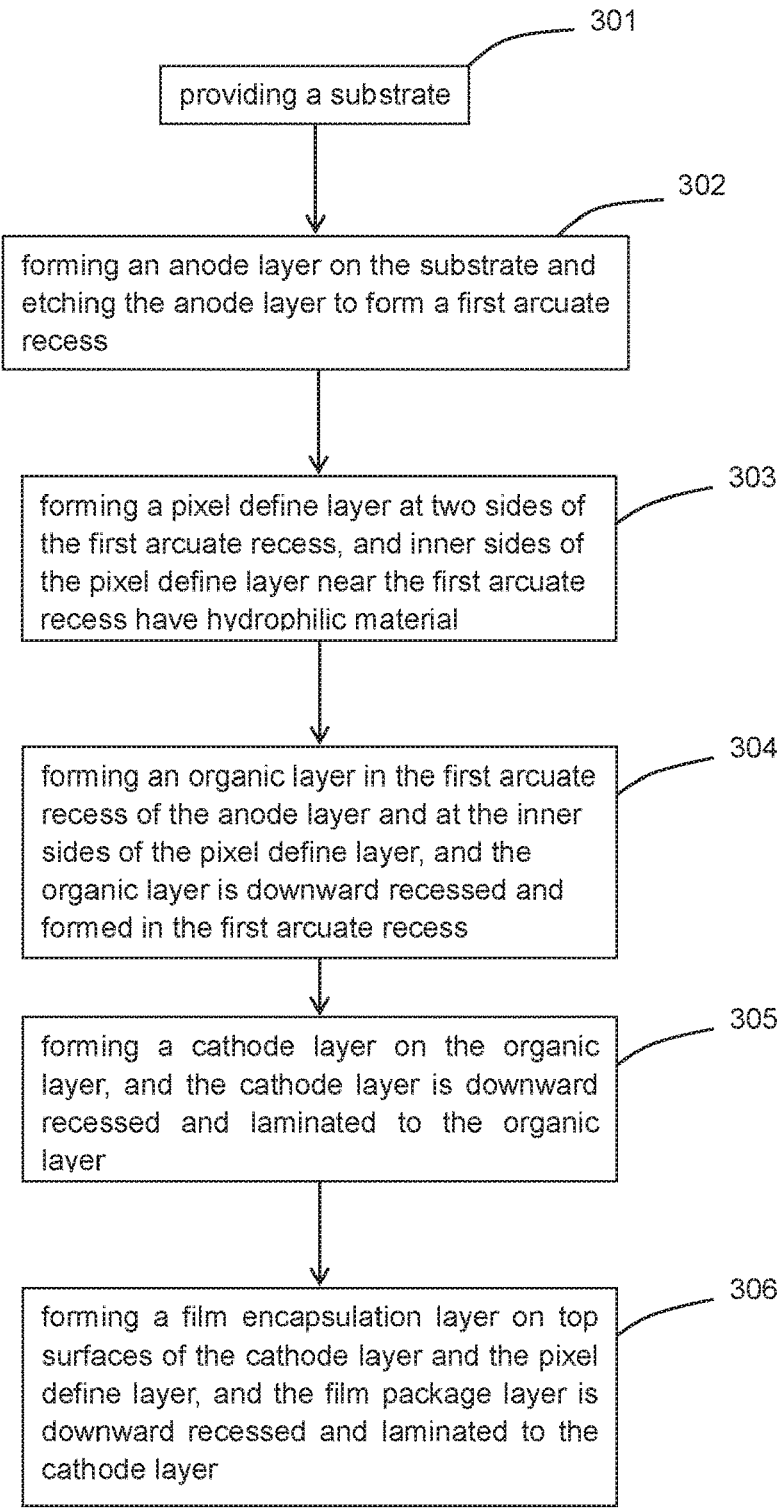
FIG. 3 is a flowchart of a method for fabricating an organic light-emitting display according to an embodiment of the disclosure.

Based on the identical invention concept, the present invention provides a method for fabricating an organic light-emitting display. FIG. 3 is a flowchart of a method for fabricating an organic light-emitting display according to an embodiment of the disclosure. The method for fabricating an organic light-emitting display comprises:

S301: A substrate is provided.

A substrate used for an organic light-emitting display is provided. The substrate is a glass substrate, a plastic substrate, or other substrates. The substrate has a uniform thickness. Taking a glass substrate as example.

S302: An anode layer is formed on the substrate, and the anode layer is downward recessed to form a first arcuate recess.

In an embodiment, the substrate is a glass substrate. The surface of the substrate has a given position where the lighting unit is located, and the given position of the substrate is bored by a laser. Afterwards, the substrate is etched by an acid solution to form the concave of the first arcuate recess that corresponds to the radian of the surface of the solution used in an ink jetting and printing process. The size and the radian of the first arcuate recess are adjusted according to the energy intensity of the laser and the concentration of the etching solution. In an embodiment, the anode layer is formed on the substrate using the low-temperature polysilicon technology, whereby the anode layer is downward recessed and laminated to the arcuate recess to form the first arcuate recess.

In another embodiment, the substrate is a glass substrate and has a uniform thickness. The anode layer is formed on the substrate using the low-temperature polysilicon technology. The surface of the anode layer has a given position where the lighting unit is located, and the given position of the substrate is bored by a laser. Afterwards, the glass substrate is etched by an acid solution to form the concave of the arcuate recess that corresponds to the radian of the surface of the solution used in an ink jetting and printing process. The size and the radian of the arcuate recess are adjusted according to the energy intensity of the laser and the concentration of the etching solution. In order to improve the efficiency of injecting holes, the work function of the anode layer 102 is required to be high as much as possible. As a part of the display, the anode layer 102 should be transparent, whereby light penetrates through the anode layer 102. For example, the anode layer 102 comprises Au and transparent conductive polymers, such as polyaniline and ITO.

S303: A pixel define layer is formed at two sides of the first arcuate recess of the anode layer such that the inner sides of the pixel define layer near the first arcuate recess have hydrophilic material.

In an embodiment, the pixel define layer is formed during coating, exposing, developing, and etching processes. The pixel define layer is formed at two sides of the first arcuate recess of the anode layer to form an opening. The inner sides of the pixel define layer near the first arcuate recess of the anode layer have hydrophilic material. The top surface of the pixel define layer has hydrophobic material.

In the abovementioned embodiment, the organic layer is accommodated in the opening of the pixel define layer having a fixed thickness. Thus, the thickness of the pixel define layer is adjusted according to the thickness of the organic layer accommodated, but the present invention is not limited thereto. Preferably, the pixel define layer has a thickness of 1~10 um.

S304: An organic layer is formed in the first arcuate recess and at the inner sides of the pixel define layer, and the organic layer is downward recessed and laminated to the first arcuate recess.

In an embodiment, the organic layer is formed by jetting ink into the opening of the pixel define layer at two sides of the first arcuate recess, and the organic layer is downward recessed and laminated to the first arcuate recess. The organic layer includes a hole injection layer, a hole transporting layer, a emitting layer, an electron transporting layer, and an electron injection layer.

In the abovementioned embodiment, the organic layer is formed by jetting ink into the opening of the pixel define layer at two sides of the first arcuate recess. In this way, the surface of the solution forming the organic layer corresponds to the concave of the first arcuate recess. As a result, the thickness of the organic layer is uniform, and the lighting efficiency and utilization in material of the display pane are improved.

S305: A cathode layer is formed on the organic layer, and the cathode layer is downward recessed and laminated to the organic layer.

In order to improve the efficiency of injecting electrons, the work function of the cathode is required to be low as much as possible, such that the lighting brightness and the life of the display increase. The cathode includes those of a single metal, an alloy or a layered electrode. The single metal may be Ag, Al, Li, Mg, Ca, or In. The alloy may be Mg:Ag (10:1) or Li:Al (0.6% Li). The layered electrode is composed of a thin insulation layer and a thick Al layer. The thin insulation layer may comprise LiF, $Li_2O$, MgO, or $Al_2O_3$.

S306: A film package layer is formed on the top surfaces of the cathode layer and the pixel define layer, and the film package layer is downward recessed and laminated to the cathode layer.

In the abovementioned embodiment, the film package layer is formed during evaporation and package processes. The order and the times of the ink jetting process forming the organic layer and the evaporation process forming the film package layer can be changed according to the properties of the organic lighting display.

Distinct from the conventional technology, a part of the anode layer of the organic light-emitting display of the present invention is downward recessed to form an arcuate recess, and the organic layer is downward recessed and laminated to the arcuate recess, and the inner sides of the pixel define layer have hydrophilic material. The organic light-emitting display of the present invention can overcome the problem with the non-uniform thickness of the organic layer in an ink-jetting process and improve the performance of the organic lighting display.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:
1. An organic light-emitting display panel, comprising:
   a substrate; and
   at least one lighting unit formed on the substrate, and the at least one lighting comprising:
   an anode layer;
   an organic layer formed on the anode layer; and
   a pixel define layer formed at two sides of the anode layer and the organic layer and touching the two sides of the anode layer and the organic layer, and inner sides of the pixel define layer touching the anode layer and the organic layer having hydrophilic material;
   wherein at least one part of the anode layer is downward recessed to form a first arcuate recess, and the organic layer is downward recessed and formed in the first arcuate recess,
   wherein the substrate comprises at least one arcuate recess downward recessed, and the anode is downward recessed and formed in the at least one arcuate recess of the substrate.

2. The organic light-emitting display panel according to claim 1, wherein a number of the arcuate recess of the substrate corresponds to a number of the lighting unit.

3. The organic light-emitting display panel according to claim 1, wherein the arcuate recess is formed by using an acid solution to etch the substrate.

4. The organic light-emitting display panel according to claim 1, wherein a top surface of the pixel define layer has hydrophobic material.

5. The organic light-emitting display panel according to claim 1, wherein the organic layer is formed by jetting ink into an opening formed by the pixel define layer at two sides.

6. The organic light-emitting display panel according to claim 1, further comprising a cathode layer formed on the organic layer and a thin film sealing layer formed on the cathode layer, and the cathode layer and the thin film sealing layer are sequentially downward recessed and formed in a recess of the organic layer.

7. An organic light-emitting display device comprising an organic light-emitting display panel, and the organic light-emitting display panel comprises:
   a substrate; and
   at least one lighting unit formed on the substrate, and the at least one lighting comprises:
   an anode layer;
   an organic layer formed on the anode layer; and
   a pixel define layer formed at two sides of the anode layer and the organic layer and touching the two sides of the anode layer and the organic layer, and inner sides of the pixel define layer touching the anode layer and the organic layer have hydrophilic material;
   wherein at least one part of the anode layer is downward recessed to form a first arcuate recess, and the organic layer is downward recessed and formed in the first arcuate recess, wherein the substrate comprises at least one arcuate recess downward recessed, and the anode is downward recessed and formed in the at least one arcuate recess of the substrate.

8. The organic light-emitting display device according to claim 7, wherein number of the arcuate recess of the substrate corresponds to number of the lighting unit.

9. The organic light-emitting display device according to claim 7, wherein the arcuate recess is formed by using an acid solution to etch the substrate.

10. The organic light-emitting display device according to claim 7, wherein a top surface of the pixel define layer has hydrophobic material.

11. The organic light-emitting display device according to claim 7, wherein the organic layer is formed by jetting ink into an opening formed by the pixel define layer.

12. The organic light-emitting display device according to claim 7, wherein the organic light-emitting display panel further comprises a cathode layer formed on the organic layer and a film package layer formed on the cathode layer, and the cathode layer and the film package layer are sequentially downward recessed and formed in a recess of the organic layer.

13. A method for fabricating an organic light-emitting display panel comprising:
providing a substrate;
forming an anode layer on the substrate, and the anode layer is downward recessed to form a first arcuate recess;
forming a pixel define layer at two sides of the first arcuate recess of the anode layer, and inner sides of the pixel define layer near the first arcuate recess have hydrophilic material;
forming an organic layer in the first arcuate recess of the anode layer and at the inner sides of the pixel define layer, and the organic layer is downward recessed and formed in the first arcuate recess;
forming a cathode layer on the organic layer, and the cathode layer is downward recessed and laminated to the organic layer; and
forming a film package layer on top surfaces of the cathode layer and the pixel define layer, and the film package layer is downward recessed and laminated to the cathode layer.

* * * * *